US005784593A

United States Patent [19]
Tseng et al.

[11] Patent Number: 5,784,593
[45] Date of Patent: Jul. 21, 1998

[54] SIMULATOR INCLUDING PROCESS LEVELIZATION

[75] Inventors: Ping-sheng Tseng, Sunnyvale; Radha Vaidyanathan, Los Altos, both of Calif.; Sivaram Krishna Nayudu, Jersey City, N.J.; Mahadevan Ganapathi, Sunnyvale, Calif.

[73] Assignee: Synopsys, Inc., Mountain View, Calif.

[21] Appl. No.: 536,031

[22] Filed: Sep. 29, 1995

[51] Int. Cl.[6] .................................................. G06F 9/455
[52] U.S. Cl. ................. 395/500; 364/232.2; 364/275.6; 364/DIG. 1
[58] Field of Search ................................ 364/488–491, 364/578; 395/500

[56] References Cited

U.S. PATENT DOCUMENTS

| | | |
|---|---|---|
| 4,315,315 | 2/1982 | Kossiakoff . |
| 4,455,619 | 6/1984 | Masui et al. . |
| 4,527,249 | 7/1985 | Van Brunt . |
| 4,584,642 | 4/1986 | Fudanuki . |
| 4,677,587 | 6/1987 | Zemany, Jr. . |
| 4,695,968 | 9/1987 | Sullivan et al. . |
| 4,725,971 | 2/1988 | Doshi . |
| 4,725,975 | 2/1988 | Sasaki . |
| 4,744,084 | 5/1988 | Beck et al. . |
| 4,787,062 | 11/1988 | Nei et al. . |
| 4,827,427 | 5/1989 | Hyduke . |
| 4,862,347 | 8/1989 | Rudy . |
| 4,882,690 | 11/1989 | Shinsha et al. . |
| 4,901,260 | 2/1990 | Lubschevsky . |
| 4,918,594 | 4/1990 | Onizuka . |
| 4,922,445 | 5/1990 | Mizoue et al. . |
| 4,937,765 | 6/1990 | Shupe et al. . |
| 5,029,102 | 7/1991 | Drumm et al. . |
| 5,062,067 | 10/1991 | Schaefer et al. . |
| 5,111,413 | 5/1992 | Lazansky et al. . |
| 5,151,867 | 9/1992 | Hooper et al. . |
| 5,175,843 | 12/1992 | Casavant et al. . |
| 5,198,705 | 3/1993 | Galbraith et al. . |
| 5,222,030 | 6/1993 | Dangelo et al. . |
| 5,313,615 | 5/1994 | Newman et al. . |
| 5,392,337 | 2/1995 | Hiserote . |
| 5,598,344 | 1/1997 | Danagelo et al. ........... 364/489 |
| 5,603,015 | 2/1997 | Kurosawa et al. ........... 395/500 |

OTHER PUBLICATIONS

"Addressing the Systems–inSilicon Verification Challenge", *The Siliconization Opportunity*, Cadence Design Systems (Publication date unknown).

"NC—Verilog Simulator", Cadence Design Systems. (Publication date unknown).

SpeedSim, Inc., SpeedSim/3 Product Background, Speed-Sim, Inc., 234 Littleton Road, Suite 2E, Westford, MA 01886 (Publication date unknown).

Voyager CS Mixed–Level VHDL System Verification Environment, by IKOS Systems, 19050 Pruneridge Avenue, Cupertino, CA 95014 (Publication date unknown).

The SpeedSim/3 Software Simulator, Reducing the Time and Cost of Design Verification, SpeedSim, Inc., 234 Littleton Road, Suite 2E, Westford, MA 01886. (Publication date unknown).

VCS—A Verilog Compiler, *Chronologic Simulation*, johna@chronologic.com. (Publication date unknown).

(List continued on next page.)

*Primary Examiner*—Jacques H. Louis-Jacques
*Assistant Examiner*—Ayni Mohamed
*Attorney, Agent, or Firm*—Graham & James LLP

[57] ABSTRACT

A method of preparing a specification of a system for simulation on a computer system. The specification includes a hardware design language specification of the system. Analyze the specification to identify a set of processes, where each process includes a plurality of statements. Determine an evaluation order of the set of processes. Generate a combined process including a portion of the plurality of statements. The portion of the plurality of statements are included in the combined process so as to be evaluated according to the evaluation order.

16 Claims, 12 Drawing Sheets

OTHER PUBLICATIONS

Russell B. Segal, BDSYN: Logic Description Translator BDSIM: Switch–Level Simulator, May 21, 1987, Memorandum No. UCB/ERL M87/33.

D.E. Thomas, The System Architect's Workbench, 1988, 23.2

Giovanni de Micheli, High–Level Synthesis of Digital Circuits, 1990, 6–7.

R. Camposano, From Behavior to Structure: High–Level Synthesis, 1990, 8–19.

J. Bhasker, An Optimizer for Hardware Synthesis, 1990, 20–36.

Giovanni de Micheli, et al., The Olympus Synthesis System, 1990, 37–53.

Srimat Chakradhar, et al., Neural Net and Boolean Satisfiability Models of Logic Circuits, 1990, 54–57.

5,784,593

1

SIMULATOR INCLUDING PROCESS LEVELIZATION

1. THE BACKGROUND OF THE INVENTION

A. The Field of the Invention

This invention relates to the field of electronic design automation. In particular, the invention relates to a cycle based simulation system.

B. A Description of the Related Art

In electronic design automation, a designer generates a specification of the behavior required of a system (a design) and a set of constraints and goals to be satisfied. Synthesis takes this specification and set of goals and constraints and generates a structure that implements the behavior while satisfying the goals and constraints. Simulation helps the designer verify the behavior of the system given the specification and a set of test inputs.

M. C. McFarland, A. C. Parker, and R. Camposano, "The High-Level Synthesis of Digital Systems," Proceedings of the IEEE, Vol. 78, No. 2, February 1990, pages 301–318, a background on the terms used in electronic design automation. The following background is derived from that paper.

Behavior means the way the system interacts with its environment including the mapping from the inputs to the outputs. Structure refers to the set of interconnected components that make up the system. The physical design of the system is the specification of how the system is built.

Different levels of detail exist for each of these domains (behavior, structure and physical design). Table 1 illustrates the relationship between the domains and the levels.

TABLE 1

| Level | Behavior | Structure | Physical Design |
|---|---|---|---|
| PMS (System) | Communicating Processes | Processors Memories Switches | Cabinets Cables |
| Instruction Set (Algorithm) | Input-Output | Memory, Ports Processors | Board Floorplan |
| Register-Transfer | Register Transfers | ALUs, Regs Muxes, Bus | ICs Macro Cells |
| Logic | Logic Equations | Gates Flip flops | Standard Cell Layout |
| Circuit | Network Equations | Transistors, Connections | Transistor Layout |

At the system level, systems are described as interconnected sets of processors, memories, and switches. At the algorithmic level, systems are described by the computations performed by a component and the way sequences of inputs are mapped to the outputs. At the register-transfer (RT) level, the system is described as a set of interconnected storage elements and functional blocks. The behavior is defined by data transfers and transformations between storage elements. RT level differs from the algorithmic level by requiring a higher level of detail of the internal specification. The logic level has the behavior specified as logic equations while the structure is described as a network of gates and flip-flops. The circuit level specifies the system as individual transistors. The different domains and levels help distinguish the different types of synthesis and simulation tools.

To further distinguish different types of simulation tools, it is important to understand the difference between event-driven simulation and cycle based simulation. Event-driven simulators propagate signals from the output of one system element to the inputs of the next system element and allow the designer to examine the results of a propagation through-

2 out a clock cycle. Additionally, the event-driven simulators simulate the propagation delay of the logic elements in the design. For example, an event driven simulator will simulate the delay of a signal through a NAND gate. Cycle based simulators allow the designer to examine the results at the end of a cycle. A cycle based simulator does not have to determine the propagation delay of the logic elements in the design. The goal of the cycle based simulator is to determine an evaluation ordering of the inputs and the outputs of the components of the system so that events need not be propagated, thereby saving a significant amount of time.

Table 2 illustrates examples of simulation tools and which levels and domains they simulate.

TABLE 2

| Level | Event-Driven | Cycle Based |
|---|---|---|
| Register Transfer | VSS ™, from Synopsys, Inc., of Mountain View, CA | |
| Logic | VSS; VerilogXL ™, from Cadence Systems, Inc., of California | SpeedSim/3 ™, from Design Acceleration of San Jose, CA; SSIM ™, from AIDA Corp., Santa Clara, CA. |

Presently, many simulators support logic level simulation. However, designers are moving toward RT level synthesis tools because the RT level allows a greater degree of abstraction, allowing the designer to more easily experiment with different designs. Therefore, it is desirable to simulate at the RT level. Event-driven RT level simulators can simulate the same RT level system specification used by the synthesis tools. However, the event driven RT level simulators do not receive the benefit of increased simulation speed that cycle based simulator receive. Therefore, it is desirable to provide a register transfer level cycle based simulator.

A distinguishing feature of the cycle based simulators is whether they can simulate asynchronous systems or not. Typically, the cycle based simulators simulate only synchronous systems. A synchronous system does not include combinational feedback loops or allow for the input of signals that are asynchronous with respect to a clock signal. A combinational feedback loop occurs where an output signal is fed back into a combinational component of a system. However, it is desirable to be able to simulate systems that include both synchronous and asynchronous components.

Additionally, desirable characteristics of synchronous systems that should be simulated include, for example, multi-phase clocking schemes and gated clocks. Multi-phase clocking schemes allow the designer to use different phases of the input clocks as input to a design. Gated clocks allow a designer to feed a clock input through combinational logic before triggering a component.

It is also desirable that systems that include internally generated state change signals be simulated. An internally generated state change signal is a signal that is internal to a design (not one of the direct inputs) that causes the state of the design to change.

2. A SUMMARY OF THE INVENTION

A simulator including process levelization is described.

A method of preparing a specification of a system for simulation on a computer system. The specification includes a hardware design language specification of the system. Analyze the specification to identify a set of processes, where each process includes a plurality of statements. Determine an evaluation order of the set of processes. Generate a combined process including a portion of the plurality of statements. The portion of the plurality of statements are included in the combined process so as to be evaluated according to the evaluation order.

Although many details have been included in the description and the figures, the invention is defined by the scope of the claims. Only limitations found in those claims apply to the invention.

3. A BRIEF DESCRIPTION OF THE DRAWINGS

The figures illustrate the invention by way of example, and not limitation. Like references indicate similar elements.

4. THE DESCRIPTION OF THE PREFERRED EMBODIMENT

A. AN OVERVIEW OF AN EMBODIMENT OF THE INVENTION

A simulator including process levelization is described.

The simulator is made of four parts: the analyzer, the elaborator with a code generator, and the run-time simulator.

The analyzer accepts a high-level description language (HDL), such as VHDL or Verilog, specification of a system, and outputs a parsed, language neutral, specification of the system. The elaborator expands the language neutral specification of the system. The elaborator can be thought of as an elaborator/code generator as it also produces an executable code representation of the system. The run-time system uses the executable code and input stimuli to produce simulation output.

These components can simulate a design that includes asynchronous signals, multi-phase clocking, gated clocks, and internally generated state change signals. In one embodiment, each of these signals is treated as a trigger. A trigger causes a change of state in the components (those components that hold state information) of the system. In one embodiment, the analyzer and the elaborator identify the types of processes and the triggers (for those processes that retain state information) in the system.

The elaborator detects processes that part of a combinational feedback loop and attempts to break the combinational feedback loop. If the combinational feedback loop cannot be broken, then a watchpoint is inserted into the loop to allow for an ordering of the processes within the combinational feedback loop.

The elaborator determines an order of evaluation of the processes in the system. From the ordered processes, the code generator generates an executable program representation of the system. The run-time system links a process, called a test bench, that drives the triggers (and the data input signals) of the executable program representation of the system.

During a cycle of simulation, the test bench and the executable program representation of the system are evaluated to determine the value of the signals in the system. During these evaluations, triggers will become active, meaning that the triggers are to cause a change of the state of a state holding process in the system. The evaluation of the test bench and the executable program continues until no more triggers are active. This is the end of a cycle of simulation and all the values of the signals in the system have been resolved. The next cycle of simulation can begin.

B. A COMPUTER SYSTEM

Figure 1:
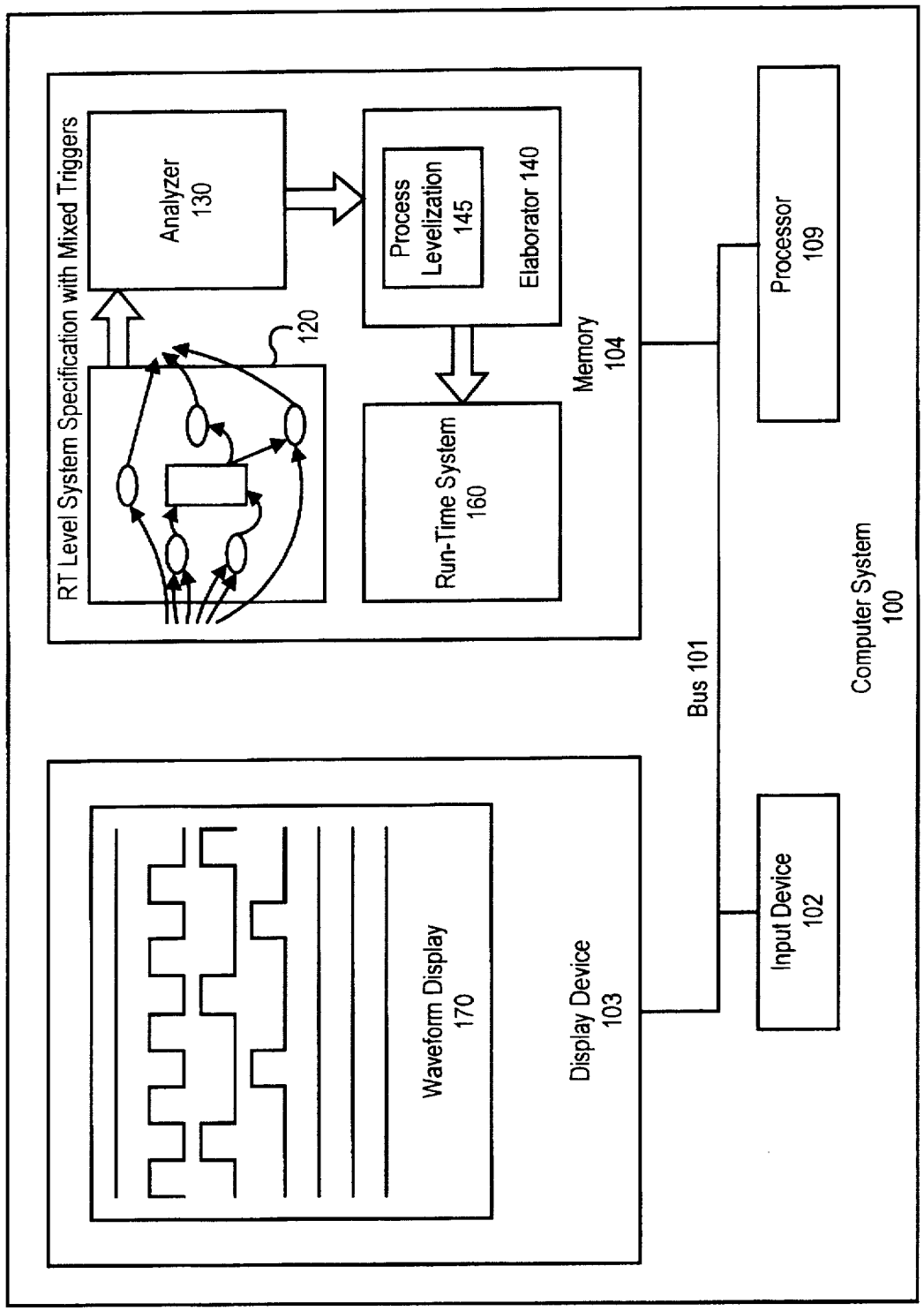
FIG. 1 illustrates a computer system.

FIG. 1 illustrates one embodiment of a computer system 100 upon which the simulator can be implemented. The computer system 100 can be a SparcStation™, available from Sun Microsystems, Inc., of Mountain View, Calif., running Unix. Other computer systems can execute the simulator such as a workstation from Hewlett-Packard or Silicon Graphics, Inc., a personal computer running Windows™, a Macintosh™ computer, or another computer system.

The computer system 100 includes a bus 101, or other communications hardware and software, for communicating information, and a processor 109, coupled with the bus 101, for processing information. The processor 109 can be a single processor or several individual processors that can work together.

The computer system 100 further includes a memory 104. The memory 104 can include a random access memory (RAM), a read only memory (ROM), a hard disk, or another storage device. The memory 104 can include a system specification. Part of the memory 104 can be included in the processor 109. The memory 104 is coupled to the bus 101 and is for storing information and instructions to be for the processor 109. In this embodiment, the memory 104 includes an RT level system specification with mixed triggers 120. The mixed triggers allow the designer to trigger various state components using a variety of trigger schemes. This is described in greater detail below. The memory 104 also includes the instructions and data for the analyzer 130, the elaborator 140 and the run-time system 160. The elaborator 140 includes the data and instructions to perform process levelization 145 of the RT level system specification with mixed triggers 120. The importance of this is described below. The run-time system 160 generates the information for the waveform display 170.

The computer system 100 can also include a display device 103 for displaying information to a user. The display device 103 can be coupled to the bus 101. The display device 103 can include a frame buffer, specialized graphics rendering devices, a cathode ray tube (CRT), and/or a flat panel display. The bus 101 can include a separate bus for use by the display device 103 alone. In this embodiment, the display device 103 is displaying the waveform display 170 that provides one method for a designer to see the results of a simulation.

An input device 102, including alphanumeric and other keys, a mouse and other input devices, is typically coupled to the bus 101 for communicating information, such as command selections, to the processor 109 from a user.

Also, the computer system 100 can be part of a computer network (for example, a LAN). In one embodiment of the invention, an entire network can then be considered part of the computer system 100.

C. AN OVERVIEW OF A SIMULATOR

Figure 2:
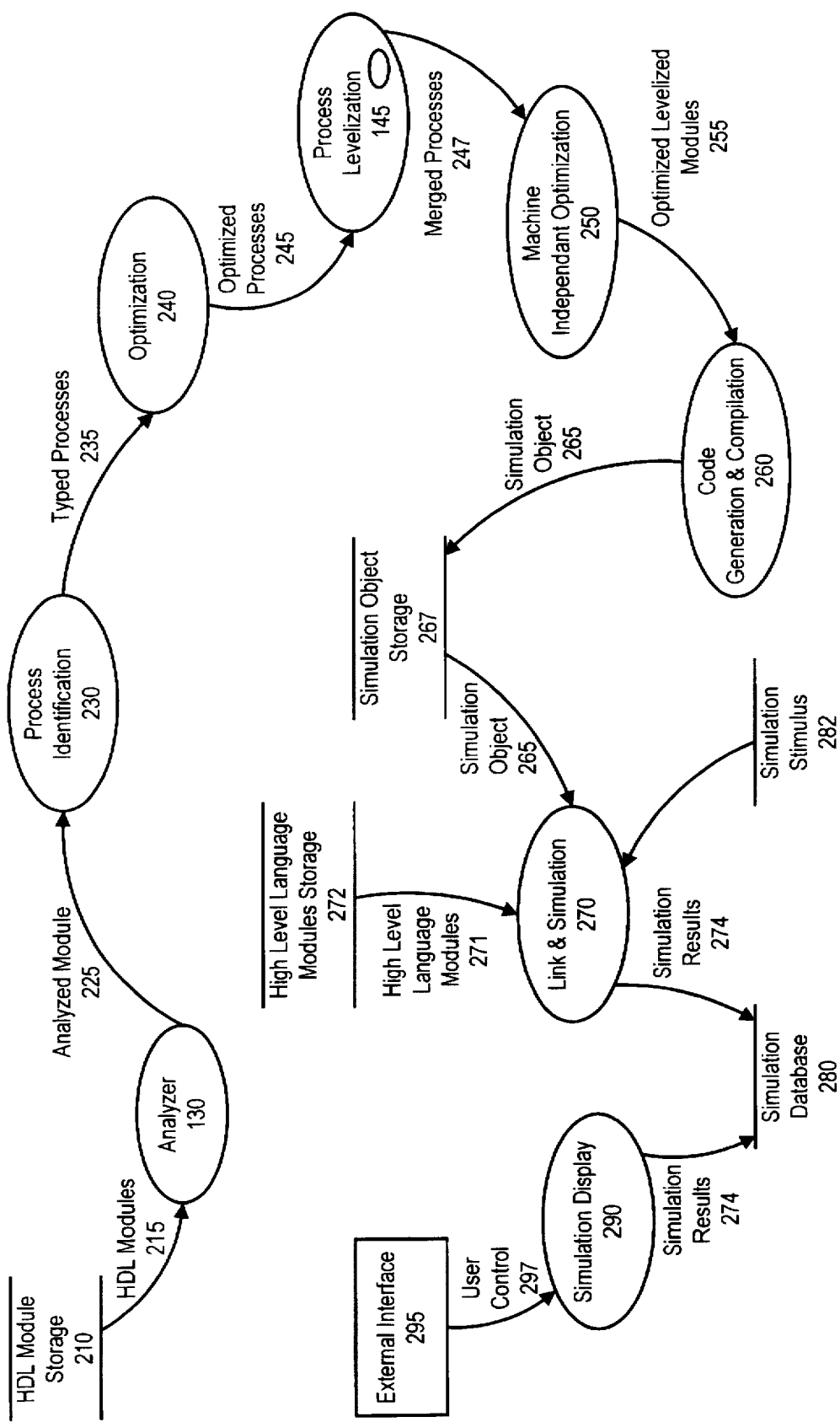
FIG. 2 illustrates a system level view of a simulator.

FIG. 2 illustrates one embodiment of the simulator.

The designer specifies a system design in HDL, such as VHDL or Verilog. A system specification is made of one or more HDL modules 215. The HDL module storage 210 stores these HDL modules 215.

Figure 3A:
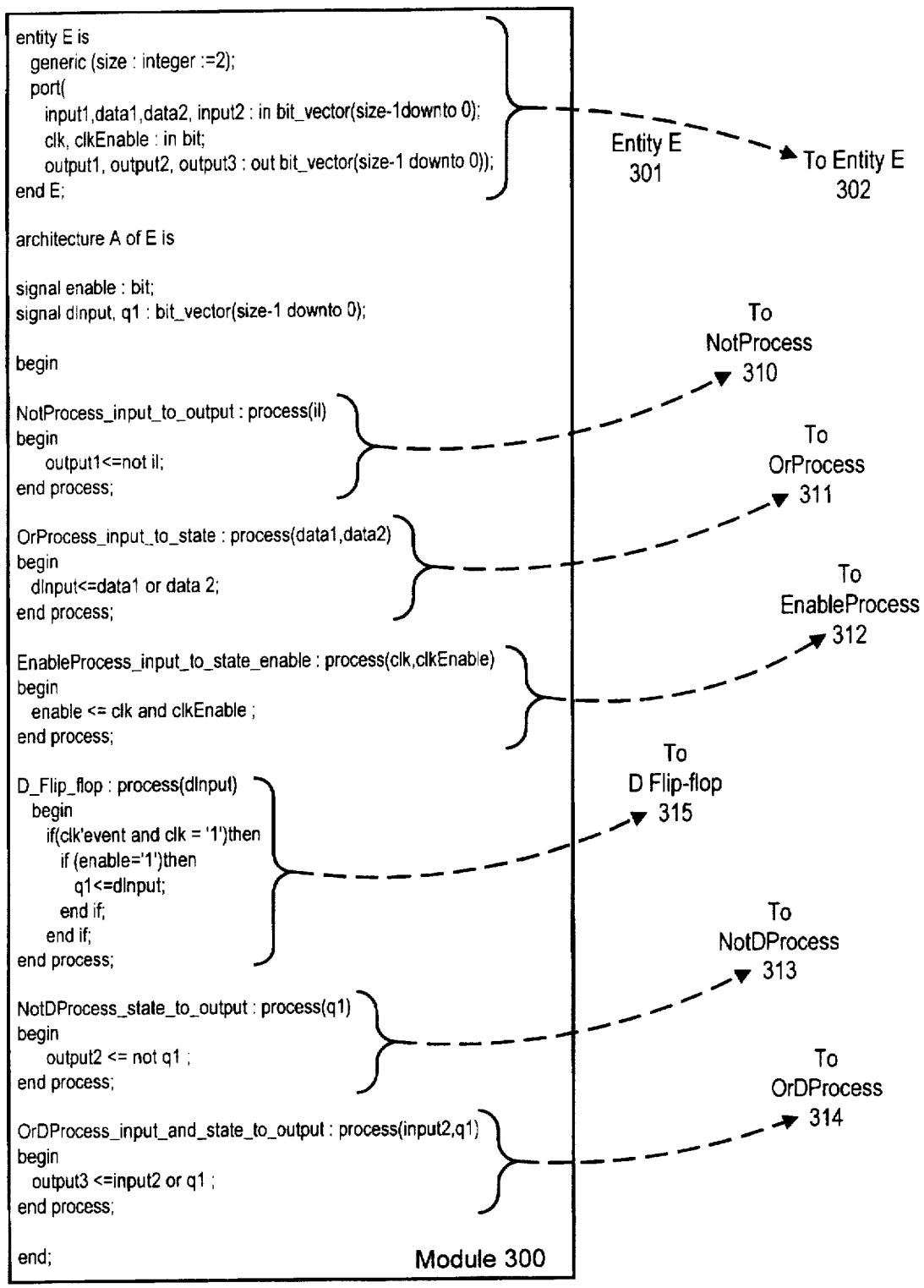
FIG. 3A illustrates an example of a register transfer level description of a system.
Figure 3B:
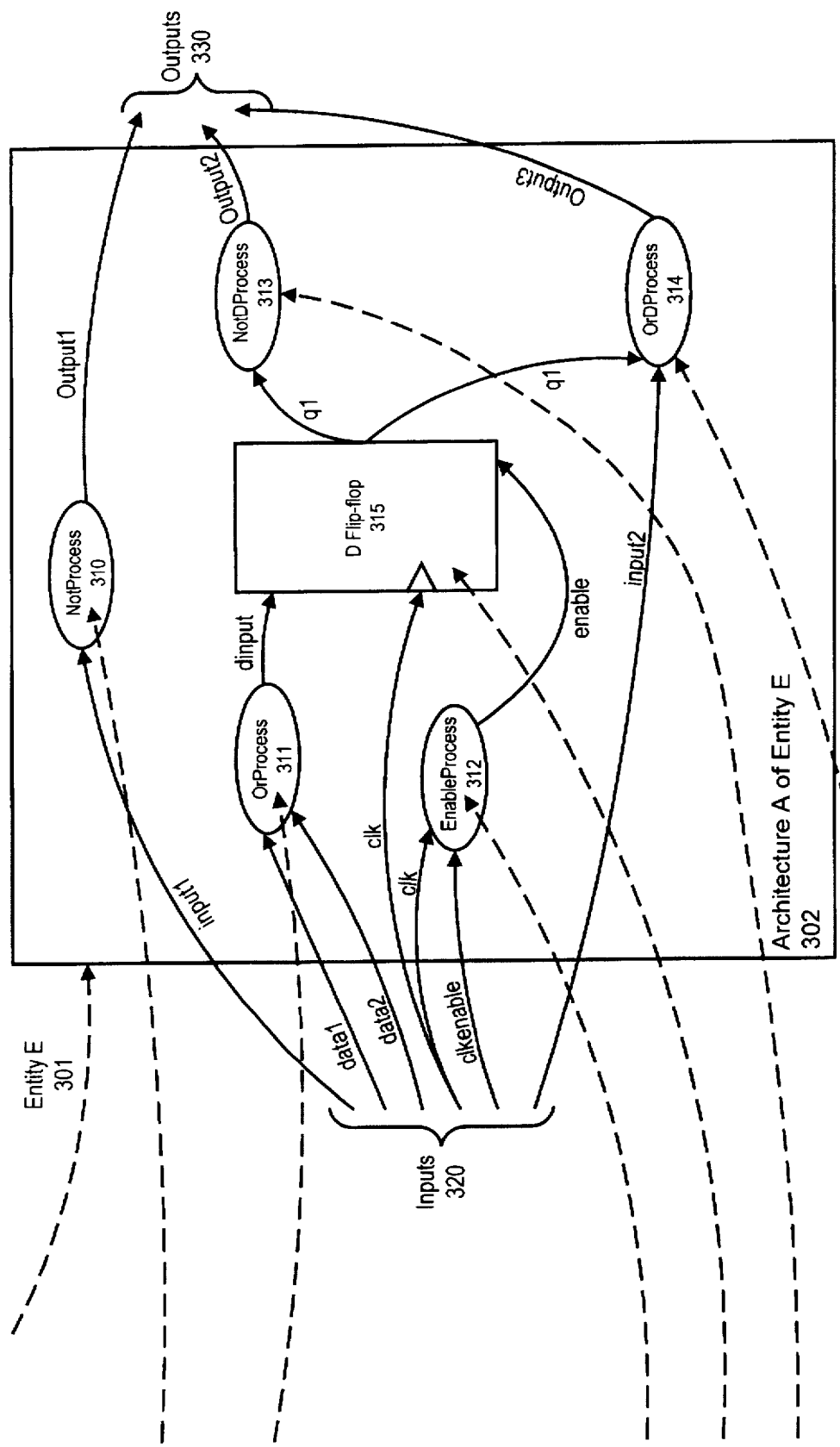
FIG. 3B illustrates the architecture of the FIG. 3A example of a registor transfer level description of a system.

FIG. 3A and 3B illustrate an example VHDL system specification module 300. The module 300 can also be called a simulation block, or "simblk." The module 300 has a defined interface and a proposed function. The interface is complete except that the timing of the interface (sequencing of the inputs) may change as the functionality of the design evolves. VHDL supports this idea by decoupling "interface" from "function" via the binding of "entity" (interface) to "architecture" (function) in the language construct "configuration." The module 300 includes an entity E 301. The entity is defined by the inputs 320 and the outputs 330. The architecture A 302 includes a number of processes: NotProcess 310, Orprocess 311, Enableprocess 312, NotProcess 313, OrDProcess 314 and D flip-flop 315. The first four processes are combinational processes. D flip-flop 315 is a process that holds state information.

The analyzer 130 receives the HDL modules 215, parses them and generates language neutral analyzed modules 125. By generating the language neutral analyzed modules 125, one embodiment has the advantage of accepting specifications written in different HDLs. For example, the simulator can simulate designs written in VHDL, Verilog, C (with parallel execution constructs), and other proprietary high-level design languages. Additionally, variations between different vendors' implementations of a specific language can be accommodated.

The analyzed modules 225 are fed to the process identification 230. The process identification 230 classifies the different types of processes. Identifying the different processes allows the process levelization 145 to order the processes for evaluation during simulation. The output of the process identification 230 is a set of typed processes 235.

Several optimization 240 steps can optionally be performed at this point.

The optimized processes 245 are then provided to the process levelization 145. The process levelization 145 attempts to find an evaluation order of the optimized processes 245. This is important because the simulator will want to find the outputs of the processes that feed the inputs of a given process before that process is evaluated. Once the correct order of evaluation has been found for the processes, the processes can then be merged by merging the statements of the processes to form large merged processes 247.

Optionally, at this point, machine independent optimizations 250 can be done on the merged processes 247. The output of the machine independent optimizations 250 are optimized levelized modules 255.

The optimized levelized modules 255 are fed to the code generation and compilation 260. Here, C code, another machine independent language, or machine specific code, is generated and compiled, if necessary. The output is a simulation object 265. The simulation object 265 can be stored in the simulation object storage 267, or can be fed directly to the link and simulation 270 step.

The link and simulation 270 step links all the simulation objects 265 and simulates the system. Additional elements can be included as part of the simulation of high-level language modules 271 (stored in the high-level language modules storage 272). The high-level language modules 271 allows a designer to integrate external C, C++, and other high level language models into the run-time system 160. Such models can represent, for example, logic or a special purpose graphical user interface.

The link and simulation step 270 outputs simulation results 274 that can be stored in the simulation database 280. The simulation results 274 can be viewed by the simulation display 290. The simulation display 290, in one embodiment, includes the waveform display 170. The designer can control the simulator, and the other system components, through the external interface 295, via the user control 297.

D. AN ANALYZER

The analyzer 130 receives the HDL modules 215, parses them and generates language neutral analyzed modules 125. The HDL modules 215 can include RT level statements.

The analyzer 130 can include an analyzer used at the front of a synthesis tool or the front of other simulators. For example, the analyzer for VSS can be used. That is, the analysis done for synthesis is similar to the analysis for simulation.

The analyzer 130 identifies the processes and the statements in the HDL modules 215. Returning to FIGS. 3A and 3B, the analyzer 130 identifies the code associated with the six processes and the statements within each process. The analyzer 130 allows the elaborator 140 to type the processes.

The analyzer 130 generates a symbol table used in run-time system 160. The symbol table provides the information to map simulation object types and values back from the run-time system 160 bits and bit vectors. The symbol table also helps map a simulation object back to the code.

E. AN ELABORATOR

The elaborator 140 expands and levelizes a design specification, given a configuration or entity/architecture pair, and produces executable code.

I. COMPUTING THE INSTANCE TREE

The elaborator 140 generates an instance tree. The instance tree represents the design hierarchy (the dependency of different modules and processes within a design). Each node in the instance tree includes: an instance name, the corresponding module information, instance specific information, and dependent module references (modules instanced by this module instance). The connectivity between the instances can be derived from the port mapping between the instances.

The elaborator 140 also resolves the values of generic parameters for an entity. The generic parameters can define the sizes of signals and the design hierarchy. Resolving these parameters is important, for example, when determining the nets because the width of signals must be resolved.

II. PROCESS IDENTIFICATION

A first step done by the elaborator 140 is to identify the different types of processes within a design. These typed processes are later manipulated so that they can be ordered.

As part of the process identification, the nets are created from the instance tree and the analyzer information. A net represents all, or part of, a signal or variable. That is, the nets represent the precise information being exchanged in a process. The creation of these nets allows later parts of the elaboration process to more accurately find the dependencies among processes. That is, if these nets were not created, the process levelization 145 may falsely assume that a process depended upon an entire signal, when it only depends on a small portion of that signal.

First, the precise information being manipulated in a processes is determined. This is done by analyzing each read and write operation within the processes. The analysis of these operations determines what portion of a signal or variable is being used at any point in a given process. For example, a process may have as an input signal an entire bit vector, but only two of the bits are used in a statement in the process. Therefore, this process only depends on those two bits, not the entire bit vector. Similarly, that statement depends on only those two bits of the signal.

Read and write operations occur where there is an assignment to any variable or signal. The following language neutral statements show what portion of an object is used by a process: load, load bits, store, store bits, load array, store array, etc. A load means the whole variable is used. A "load x bits" means only the x number of bits of a bit vector are used.

As part of the process identification, the processes can be initially identified as purely combinational, purely sequential, sequential complex or combo-seq. The combinational processes do not keep state information. The sequential processes keep state information and do not include combinational logic at any of their inputs or outputs. The sequential complex processes are sequential processes that include some combinational decision making at the inputs or outputs. The combo-seq processes include both combinational and sequential statements.

These processes are generally identified as follows:

Sequential: "wait for (x)" statement and "event" statements. An example of a sequential process is an instance of a register.

Sequential Complex: occur when a "wait" or an "event" decision is more complicated than a basic level triggered signal, or a rising or falling edge triggered signal. An example of a basic rising edged triggered signal is "if (clock'event and clock=1)."

Combinational: has no waits. It does not matter how often the evaluation of this process occurs, the output does not change if the inputs stay the same.

Combo-seq: includes both combinational statements and sequential statements in one process.

The way particular HDL constructs are identified as one of these types is similar to techniques used in synthesis tools. For example, the "HDL Coding Styles Sequential Devices Application Note," available from Synopsys, Inc. of Mountain View, Calif., describes HDL constructs and how they are interpreted. In one embodiment, the elaborator can identify the types of the processes for a synthesizable subset of the HDL constructs. This is important because a designer can synthesize the design that is simulated.

The process identification 230 detects all the edge triggered processes. The level triggered processes are detected later in the elaboration. The edge triggered processes can be triggered by, for example, an clock input from different phases of a clock, a gated clock, an asynchronous set of reset signal, or an internally generated signal. Importantly, the process identification 230 does not distinguish between these types of triggers.

The edge triggered processes correspond to either sequential, sequential complex or combo-seq process types. Edge triggered processes are relatively simply identified because of the HDL language constructs. For example, the following illustrates how an edge triggered process is identified.

```
aProcess: process (signals)
   begin
      combinational statement
      combinational statement
      if (clock'event and clock=1)
         if (firstCondition)
            if (secondCondition)
               wait . . .
      combinational statement
   end
```

In this example, there are four top level statements. At first glance, the process can be marked as sequential because it includes the "if(clock'event and clock=1)," meaning that if a rising clock edge is received, execute the following. Further examination of the process shows that the process can be marked as sequential complex because of the complexity of the decisions made before the "wait"—"if (firstCondition) and if(secondCondition) . . . " As noted above, if the decisions are more complex than deciding whether a clock, enable, reset, set, or the like, then the process is not typed as sequential (it may be typed as sequential complex). In this case the process includes a number of combinational statements, therefore, the process is marked as combo-seq.

(1) PROCESS TYPE REFINEMENT

For each of the combo-seq processes, an attempt is made to slice the process into combinational only and sequential only processes. Slicing involves creating new processes out of the statements in the combo-seq process. That is, all the combinational statements that feed the sequential statements are grouped together into a new input combinational only process. The sequential statements are grouped together into a new sequential only process. All the combinational statements that use the output of the sequential statements are grouped into a new output combinational process. The benefit of slicing the combo-seq processes is that the new combinational processes can then be combined with other combinational processes thereby allowing further optimizations.

Splitting a combo-seq process involves the following steps.

1. First, find the types of communication, if any, occurring between the combinational parts of the process and the sequential parts of the process. This is done by determining whether any variables or signals used in one part of the process are used in another part. A variable differs from a signal in several ways. Importantly, a variable changes value immediately when the assignment value changes. For a signal, the value changes one delta cycle after the assignment. Further, processes can only communicate between themselves via signals. In one embodiment, a live variable analysis is done to find communications paths that use variables. The nets created above are used to perform the live variable analysis. The live variable analysis finds, between the sequential part and the combination parts, whether a variable assigned in one part is then used in another part. If so, these parts cannot be split.

2. If no communications occur between the combinational and the sequential parts of the process, then a new process(es) is created for the sequential part(s) and a new process(es) for the combinational part(s) are created. For example:

```
aProcess : process(aSignal, bSignal, cSignal, dSignal, eSignal)
begin
    aSignal <= not bSignal;
    if(clock'event and clock='1') then
        dSignal <= cSignal and bSignal;
    end if;
    eSignal <= not aSignal;
end
becomes:
aNewComboProcess : process (aSignal, bSignal)
begin
    aSignal <= not bSignal;
end
aNewSeqProcess: process (bSignal, cSignal, dSignal)
begin
    if(clock'event and clock='1') then
        dSignal <= cSignal and bSignal;
    end if;
end
aNewComboProcess : process(aSignal, eSignal)
begin
    eSignal <= not aSignal;
end
```

3. Similarly, if there are communications using a signal, the process is split. The following example includes a signal communication path ("aSignal") between the combinational statement and the sequential statement.

```
aProcess : process(aSignal, bSignal, cSignal, dSignal)
begin
    aSignal <= bSignal and cSignal;
    if(clock'event and clock='1') then
        dSignal <= aSignal;
    end if;
end
becomes:
newComboProcess : process(aSignal, bSignal, cSignal)
    begin
        aSignal <= bSignal and cSignal;
    end
newSequentialProcess : process (aSignal, dSignal)
    begin
        if(clock'event and clock='1') then
            dSignal <= aSignal;
        end
```

The following example illustrates a process where a combinational part and a sequential part of a process cannot be spit apart. In this example, the combinational part assigns a value to the variable 'v.' The sequential part then uses the value of this variable.

```
noSplitProcess : process (aSignal, bSignal, cSignal)
    variable v;
begin
    v := (aSignal + bSignal) and 0x8000;
    if (clock'event and clock='1') then
        cSignal <= v;
    endif;
end
```

In the above case, there is a communication of the variable 'v' between the combinational statement that assigns 'v' and the sequential statement that causes the signal 'cSignal' to change. Therefore, the process cannot be split into two separate processes.

Of course combo-seq processes may be only partially split. For example, only part of the combinational statements may be split from a process, the remaining statements would be classified as a new combo-seq process.

In another embodiment, the process is split by changing a variable to a signal (e.g., 'v' from a variable to a signal).

The new processes use the signal 'v' to communicate. However, this introduces the possibility of not simulating the exact circuit specified.

In one embodiment, the triggered processes can be split along their triggers. Each new sequential process changing state in response to a different trigger. This is important in one embodiment so a minimum number of statements are evaluated when a given trigger becomes active.

(2) INPUT/OUTPUT ANALYSIS

After the processes have been initially typed, the inputs and the outputs dependencies for each process are found. This can require a significant amount of the computer system 100 resources because potentially thousands of processes have been created by the above process slicing. Finding the inputs and the outputs, allows the process levelization 145 to order the processes during levelization. The following describes the dependency analysis.

(A) DATAFLOW ANALYSIS

Dataflow analysis is used to find the dependencies between the input and the outputs of the processes in the design. The dependencies are represented by a dependency graph. A dependency graph for a process is created by examining the output signals of the process. An output signal of a process is any signal assigned in the process (e.g., aSignal<=aVar*bSignal). The dependency graph is built by finding the dependencies of the nets from the output nets of the process to the input nets of the process. In this way, only the input signals that effect the outputs are included in dependency graph.

Importantly, the elaborator 140 does not have to rely on a designer supplied dependency list (sensitivity list) for each process. A sensitivity list shows which signals a process is sensitive to. In one embodiment, the elaborator 140 can use the sensitivity list if it is supplied.

At this point, it is possible to perform an optimization to remove redundant signal assignments. A redundant signal assignment occurs when a signal is assigned a first value and then is assigned a second value without ever using the first assigned value. For example, in one process, assume signal X is assigned the value of Y. Later in that process, X is assigned the value of Z. At no point between these two assignments is X used. Redundant signal assignment elimination would eliminate the statement that assigned X the value of Y.

(B) LEVEL TRIGGERED DEVICE DETECTION

Once the nets are created, with their dependencies found, level triggered device detection is performed. This allows a designer simulate a design that includes level triggered latches. Additionally, the simulator can simulate systems that include internally generated signals that level trigger these latches. Level triggered device detection is performed on the combinational processes.

To infer a level triggered device, the elaborator 140 examines the nets and looks for the nets that are only partially assigned. That is, they are only changed in one half of a binary condition. The following example illustrates a process that would be first classified as combinational, but would then be reclassified as sequential.

```
latchProcess : process(...)
begin
    if(condition = 1) then
        q <= data;
end
```

The "if condition true" with a signal assignment shows the presence of a level triggered device. The latch is inferred because "if the condition is not true," then q does not change. Therefore, the process is not a combinational process. The process is identified as sequential, combo-seq, or sequential complex. The process can then be sliced if it is combo-seq.

III. OPTIMIZATION

At this point, the optimization 240 step is optionally performed on the output of the process identification 230. Optimizations can be performed throughout the analysis, elaboration and simulation process. Some optimizations are repeated at different parts of the system.

Procedure in-lining can optionally be performed at the optimization 240 step. Procedure in-lining is similar to procedure in-lining in compilers. Here, rather than make a call to another procedure, the statements from that procedure are included directly in the calling process.

IV. PROCESS LEVELIZATION

After the process identification 230, and the optional optimization 240, the process levelization occurs. Process levelization attempts to find the ordering of the evaluations of the statements in the processes.

Figure 4:
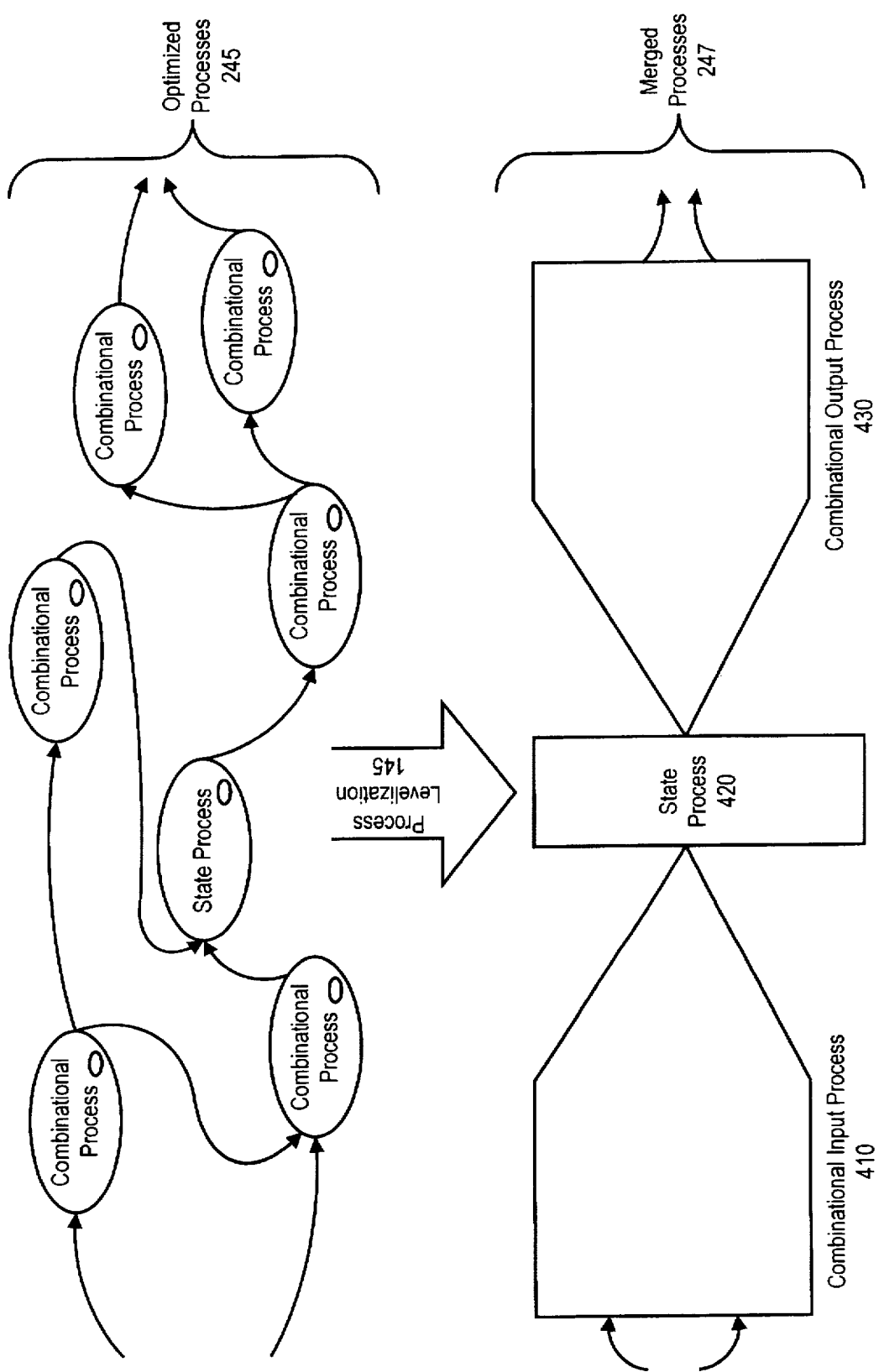
FIG. 4 illustrates an example of process levelization.

FIG. 4 illustrates a general model of a system with state and combinational processes. The optimized processes 245 are represented by several typed processes. The process levelization 145 merges the input combinational processes into the combinational input process 410. The sequential processes are merged into the state process 420. The output combinational processes are merge into the combinational output process 430. Thus, in one simulation cycle, the combinational input process 410 can be executed, then the state process 420, and then the combinational output process 430. That is, in one cycle, the values of the signals are pushed through the combinational input process 410, through the state process 420 and into the combinational output process 430.

Figure 5:
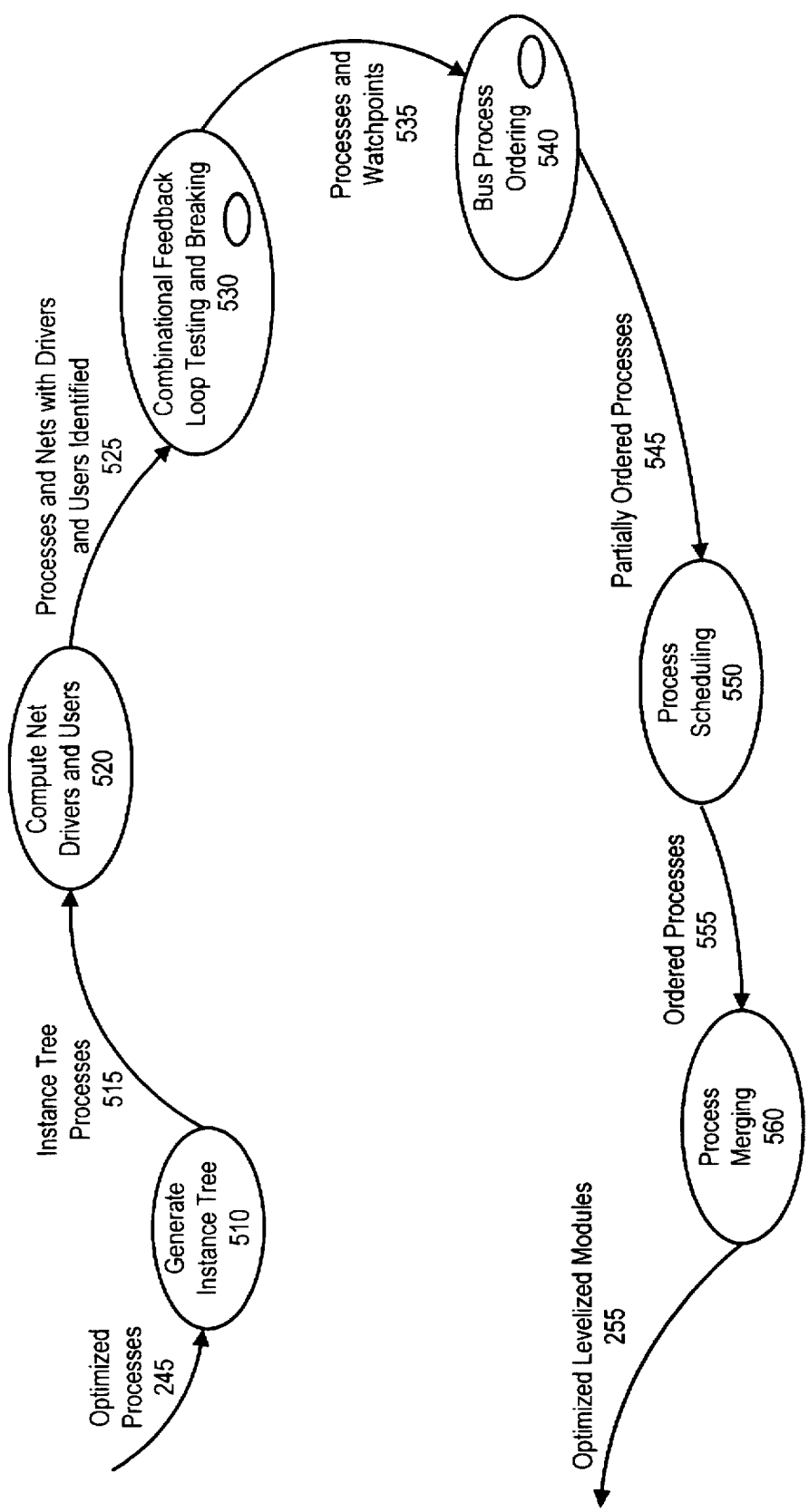
FIG. 5 illustrates an embodiment of a method of process levelization.

FIG. 5 illustrates one embodiment of the process levelization 145.

The optimized processes 245 are fed to the flattened instance tree 510. The instance tree represents the design hierarchy of the system. Flattening the instance tree flattens the design hierarchy. That is, any modules referenced by a parent module are included in that parent module's instance tree. This allows the process levelization to levelize the entire design hierarchy. From the flattened instance tree, a netlist is generated. A net in the netlist identifies a signal in the design. From the netlist, the processes that use particular signals can be found. Also, all of the triggers for a given simulation block in the instance tree are collected. These triggers are used to order the processes during the process levelization.

Once all the information for the instance tree has been determined, the instance tree processes 515 are fed to the compute drivers and users 520. This step finds all the drivers and users of a net. A driver is a process that outputs to a net (changes the value of a signal). The driver is referenced by an index to that process's OUT list (a list of OUT signals for that process). A user is a process that reads from a net—uses a net value. A user is referenced by an index to that process's IN list (a list of IN signals for that process). By identifying the drivers and the users of the nets, the process levelization can order the execution of processes so that drivers are evaluated prior to users. In the example of FIGS. 3A and 3B, EnableProcess 312 is a driver process of the net associated with enable, while NotDProcess 313 is a user process of the net associated with q1.

The processes and nets with the drivers and users identified 525 is fed to the combinational feedback loop testing and breaking 530. Combinational feedback loop testing and breaking 530 is important because it allows a designer to simulate systems including combinational feedback loops. Combinational feedback loops occur where the output of one combinational process eventually feeds back into itself. Systems including carry look-ahead adders and systems with buffered busses can include combinational feedback loops. Combinational feedback loops cause problems for cycle based simulators because the order of evaluation of processes in a combinational feedback loop is indeterminate without further analysis. In one embodiment, processes are analyzed in an attempt to either break the combinational feedback loops or determine a way in which they can be simulated.

Figure 6:
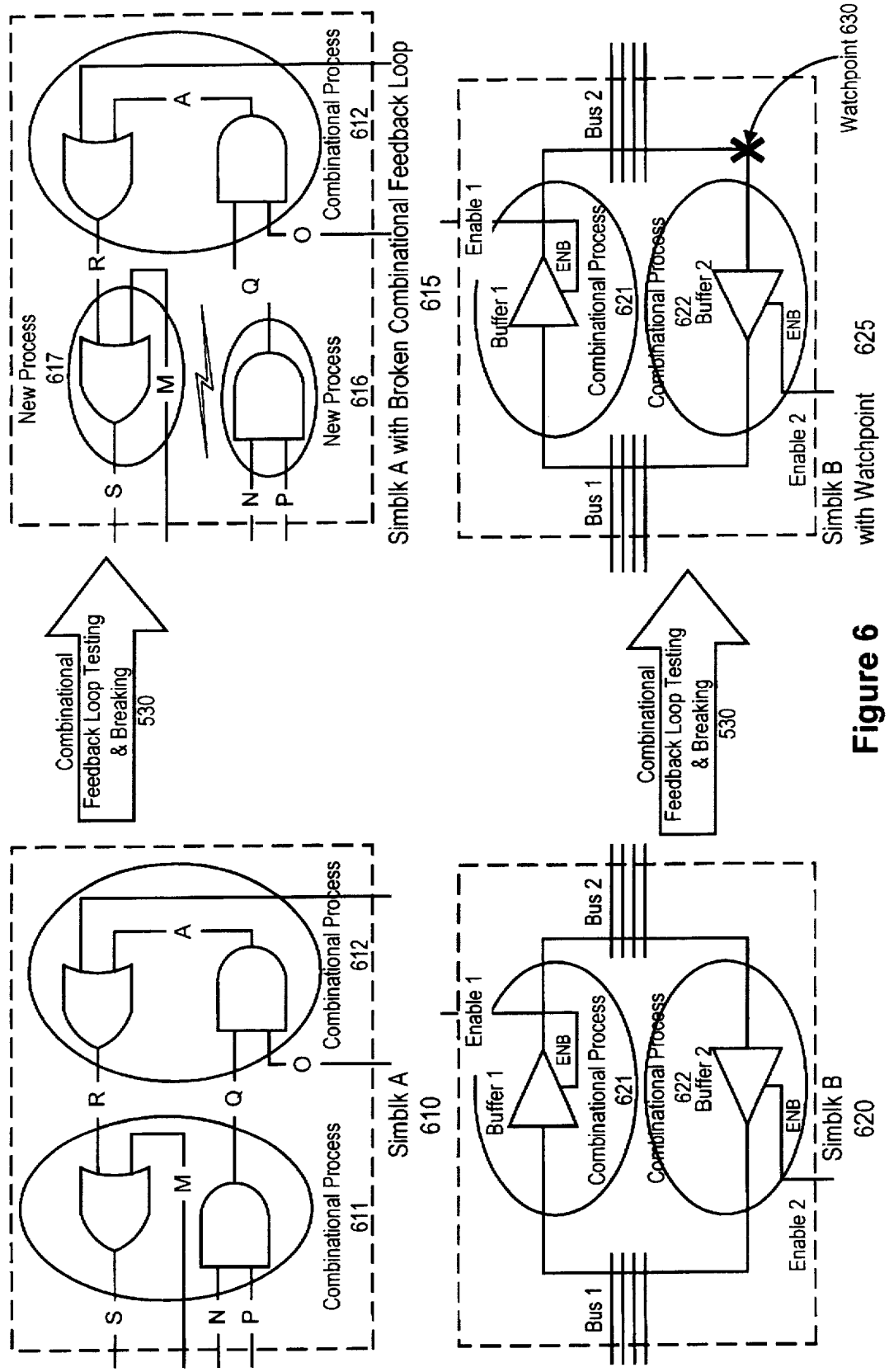
FIG. 6 illustrates systems including combinational feedback loops.

FIG. 6 illustrates two simblks with combinational feedback loops. The simblk A 610 has two combinational processes that form a combinational feedback loop: a combinational process 611 and a combinational process 612. The combinational process 611 has the output of signal S dependent on the signal R. However, signal R is dependent upon the input signal Q of combinational process 612. The signal Q is also an output signal of the combinational process 611. Thus, a combinational feedback loop exists as the output signal Q is fed back into the combinational process 611 by the combinational process 612. Without analyzing the dependencies within the processes, it is not clear in which order the combinational processes should be evaluated. Similarly, the simblk B 620, a typical buffered bus system, has a combinational feedback loop between the combinational process 621 and the combinational process 622.

Figure 7:
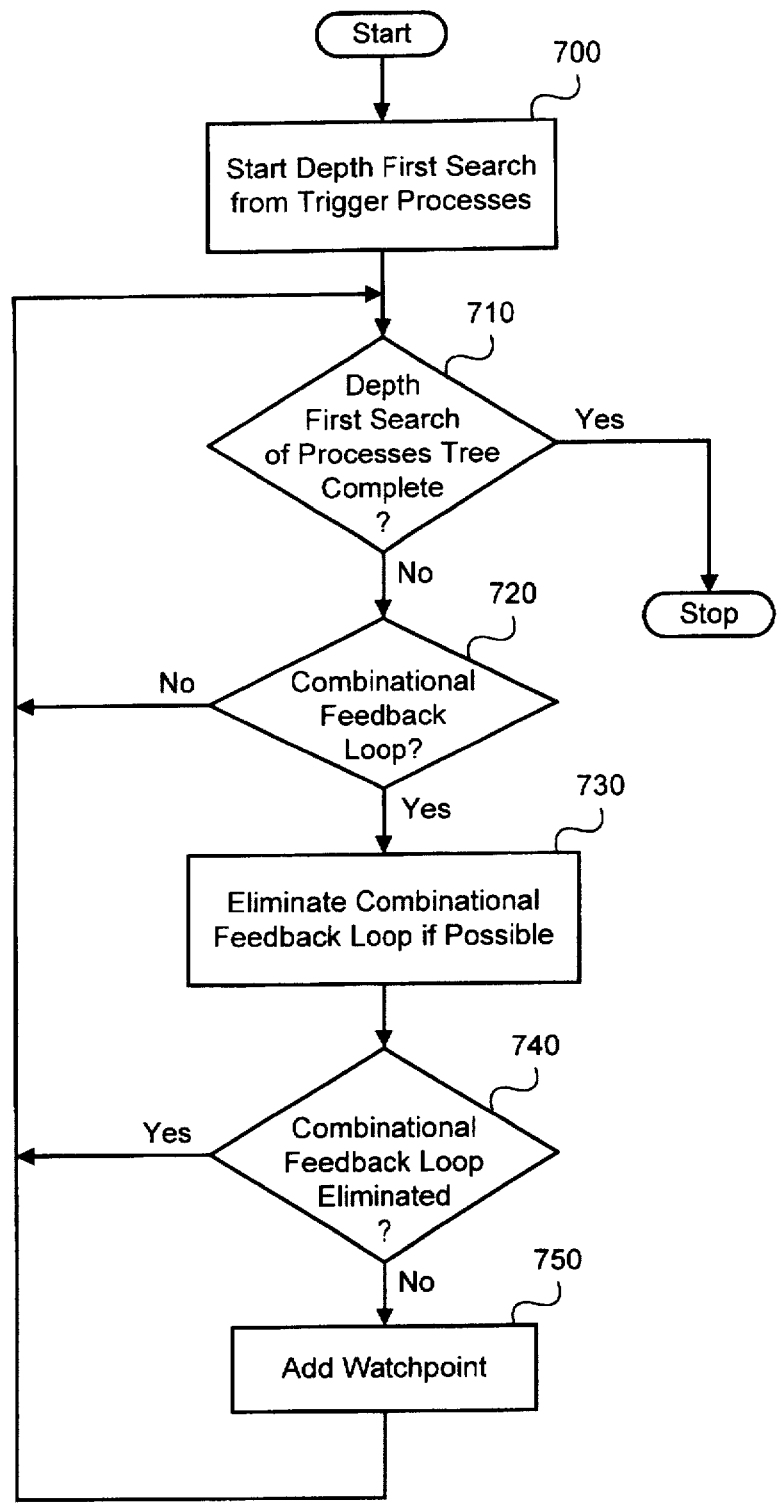
FIG. 7 illustrates an embodiment of a method of combinational feedback loop testing and breaking.

FIG. 7 illustrates one embodiment of a method of testing and breaking combinational feedback loops in a system.

At the step 700, a depth first search of the instance tree structure is started. Each process in the instance tree will be tested for a combinational feedback loop.

The step 710 ensures that all the processes in the instance tree have been tested.

At the step 720, a test is made to determine whether a process is part of a combinational feedback loop. In one embodiment, only the combinational processes need be tested for combinational feedback loops as these are the only processes in which a combinational feedback loop can occur. That is, the sequential processes and the sequential complex processes are not, by definition, part of a combinational feedback loop. To determine whether a combinational process is part of a combinational feedback loop, first examine all the drivers of its input nets. A driver process returns that no combinational feedback loop exists if the driver process is a sequential process or if it has already been tested for a combinational feedback loop and none was found. Otherwise, the drivers of that process are tested. This is done recursively until it is determined that no combinational feedback loop is found or the original combinational process is determined to be a driver process of itself (a combination feedback loop exists).

Figure 8:
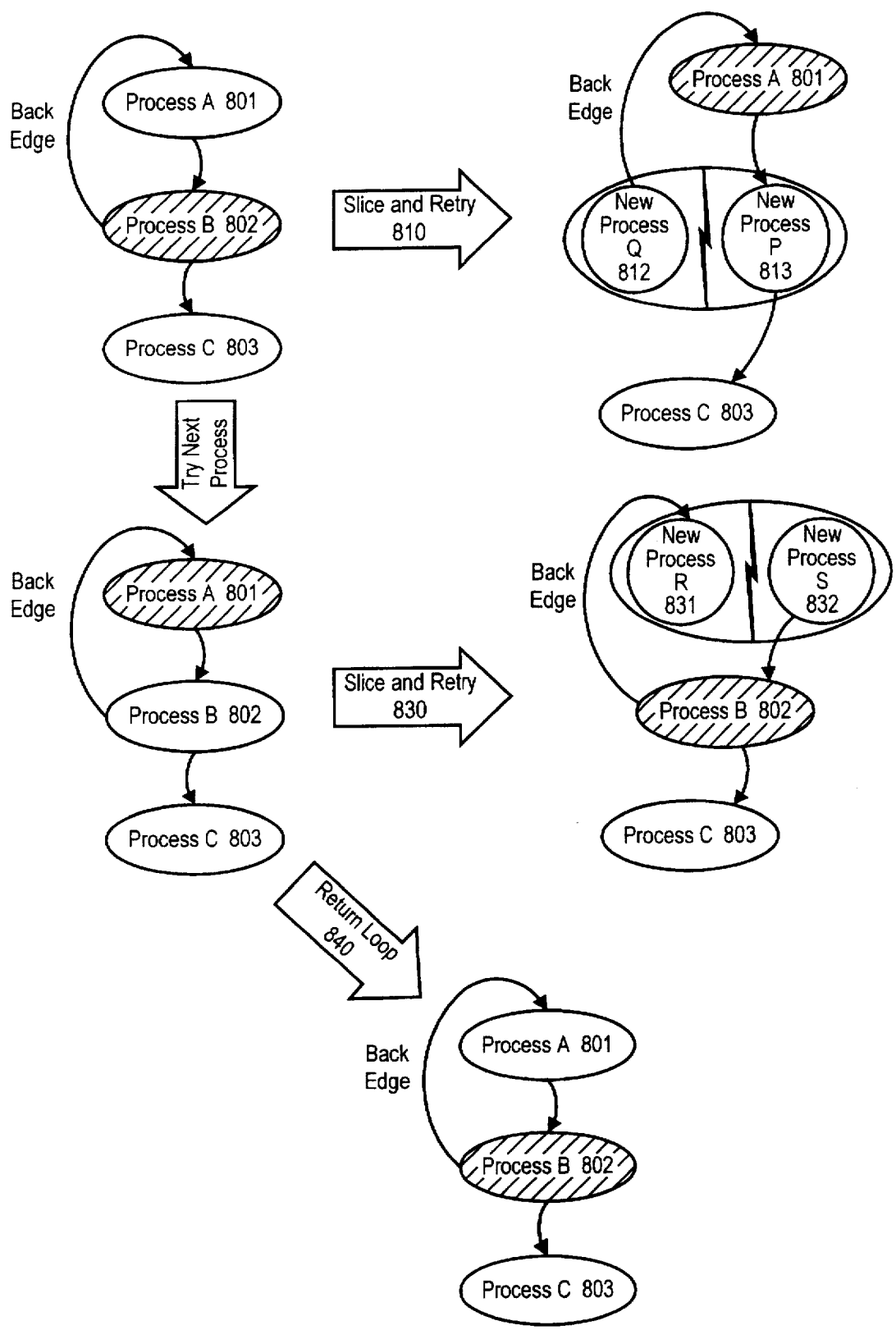
FIG. 8 illustrates breaking a combinational feedback loop.

If a combinational feedback loop is found, then at step 730, an attempt is made to break the combinational feedback loop. It is important to note that not all combinational feedback loops can be broken. In FIG. 6, the simblk A 610, after step 730, results in simblk A without combinational feedback loop 615. The combinational feedback loop is broken into the combinational process 611 into a new process 616 and a new process 617. Now the processes in the simblk A 615 can be ordered. FIG. 8 illustrates one embodiment of the step 730.

FIG. 8 illustrates a combinational feedback loop among three processes: a process A 801, a process B 802 and a process C 803. More particularly, the combinational feedback loop exists between the process B 802 and the process A 801. The process A 801 is a driver of a net used by the process B 802. The process B 802 drives a net used by the process C 803. The process B 802 drives a net used by the process A 801 (that is, the process B 802 has a back edge to the process A 801).

The first step in breaking the combinational feedback loop is to attempt to slice out some statements from the current process (e.g., process B 802) to create a new process. Thus, the slice and retry step 810 finds all the statements in the process B 802 that modify the signals on the back edge. These statements are put into a new process Q 812. The remaining statements are put into the new process P 813. Alternatively, one of the sets of statements can be left in the process B 802. In either case, beginning from the new process Q 812, the test for a combinational feedback loop is made (the step 720). Note, the slicing of the process B 802 is not kept if the combinational feedback loop is not broken.

If a combinational feedback loop still exists, attempts are made at slicing each of the remaining processes in the combinational feedback loop. For example, at the step 830, the next process, the process A 801, is sliced and tested to determine whether the combinational feedback loop has been broken. In this example, the process A 801 is sliced into the new process R 831 and the new process S 832. Again, at the step 830, the newly sliced processes are tested to determine whether the combinational feedback loop still exists.

If the combinational feedback loop cannot be eliminated, then at step 840, this information is returned by the step 730.

The step 740 checks whether the step 730 eliminated the combinational feedback loop. If not, then at step 750 a watchpoint is inserted into the combinational feedback loop. The watchpoint allows the processes in the combinational feedback loop to be ordered so that the cycle based simulation of the combinational feedback loop can occur. In one embodiment, the watchpoint is inserted arbitrarily into one of the nets in the loop. The watchpoint acts as a place identifier within a combinational feedback loop. In one embodiment, the watchpoint acts as a starting point (or ending point) for the ordering of the evaluation of the processes. Returning to the examples of FIG. 6, the simblk B 620 includes a combinational feedback loop that cannot be broken. In this case, a watchpoint 630 is inserted. The watchpoint 630 is used as a starting point for the evaluation of the two processes. The combinational process 622 will be evaluated before the combinational process 621. In one embodiment, to simplify the handling of the watchpoints, a watchpoint is treated as an internally generated trigger.

During a simulation, the net associated with a watchpoint is evaluated until the value of the signals associated with that net stabilize. That is, during a cycle of simulation, the watchpoint is tested to determine whether the values of the signals in the loop with the watchpoint have changed. If the values have changed, they may affect the values of other signals. Therefore, the statements in the loop must be evaluated until the values of the signals stabilize. The maximum number of iterations of the evaluation is equal to the number of triggers in the system. For example, if the system includes three triggers, then after evaluating the statements associated with the loop three times, the values of the signals should not change again. Note, in one embodiment, the designer is notified if a the values in the loop have not stabilized after the maximum number of iterations. This saves the designer time by detecting unstable designs. In other simulators, the designer must examine the output of the simulation to find the unstable loop and the unstable design. Having the designer search for these unstable designs is a time consuming and error prone process which is eliminated in one embodiment of the invention.

Thus, by using the embodiment of FIG. 7, combinational loops can be simulated in one embodiment of the invention. The result of the combinational feedback loop testing and breaking 573 step is the processes and watchpoints 535.

Returning to the process levelization embodiment of FIG. 5, the processes and watchpoints 535 are provided to the bus process ordering 540 step. In the bus process ordering 540 step, an initial ordering of processes is performed to ensure that all the drivers of a bus are evaluated, during simulation, before all the users of a bus. A bus is a net with multiple driver processes or user processes.

Additionally, for bus nets, a bus resolution and test process is created. The bus resolution and test process first determines the value of the bus from all of the drivers. It ensures that there is no error where two drivers are driving conflicting values onto the bus. Scheduling constraints are then added for this process. All the bus signal users wait for the bus resolution and test process. The bus resolution and test process waits for the bus driver processes. The results of the bus process ordering 540 step are the partially ordered processes 545.

Next, the process scheduling 550 step orders the processes using the driver and user information for the nets. The process scheduling 550 step begins with the processes that have an external trigger. The process scheduling 550 then ensures that a process is not evaluated until after all the driver processes to its inputs have been evaluated. The results of the process scheduling 550 step are the ordered processes 555. In one embodiment, the ordered processes 555 is a linked list of processes. The first process in the list is to be evaluated before the next process in the list. Note that during the process scheduling 550, if the evaluation order of two processes does not matter, then their order in the linked list is not important. For example, it does not matter whether NotDProcess 313 is evaluated before or after OrDProcess 314; therefore, their order in the linked list can be arbitrary.

After the process scheduling 550, the ordered processes 555 are merged in the process merging 560 step. Processes are merged according to their types. The statements of the processes that have the same trigger are merged into one new state process 420. The combinational processes are then combined according to whether they are part of the combinational input process 410 or the combinational output process 430. The order of the statements within the new processes is found by the order of these processes in the ordered processes 555. Note the combinational processes that are part of neither the input cloud nor the output cloud, such as the NotProcess 310 process, can be included in either combinational process. In one embodiment, these combinational processes are included in the combinational input process 410.

V. MACHINE INDEPENDENT OPTIMIZATIONS

After the process levelization 145, the merged processes 247 are fed to the machine independent optimization 250. The machine independent optimization 250 optionally performs several optimizations that are independent of the computer system 100. The optimizations increase the speed of execution of the simulation. These optimizations can be performed at various times during the elaboration and code generation. An optimization may be applied multiple times.

The following optimizations are included in one embodiment of the invention. Other embodiments of the invention include some of these optimizations. Other optimizations can be included.

1. loop unrolling: removes loops based upon increment, compare and branch sequences (e.g., "for" and "while" loops) by removing the incrementing and comparison and repeating the body of the loop by the number of iterations of the loop.

2. load/store promotion: removes the need to store a variable to memory by keeping the variable's value in a register. For example, the variable 'a' will be kept in a register rather than memory so that the value need not be stored to and loaded from memory.

$a := b+C;$ $f := 4*a+w;$ 3. copy propagation: reduces he number of variables that need be kept by copying the value of variable, used like a constant, to those places where the variable is referenced.

4. dead code elimination: removes code that cannot be reached during the execution of the program or code where the result is never referenced.

5. process forwarding: moves the evaluation of a statement (or a process) from before a multiplexed set of possible outcomes to within only those outcomes that use the results of that statement.

6. procedure in-lining: reduces the number of procedure calls during the simulation by replacing a call to a procedure with the body of that procedure.

7. common sub-expression elimination: eliminates the redundant evaluations of an expression. For example, if the code is "a :=b+c+b+c," then common sub-expression elimination can result in the following code:

$temp := b+c$ $a := temp+temp$

In one embodiment, an optimized version and a non-optimized version of the code are generated. The non-optimized version can be used in the debugging of the design while the optimized version can be used to run the simulation much more quickly.

In one embodiment, machine dependent optimizations can be performed. These optimizations take advantage of the specific architecture of the computer system 100.

VI. CODE GENERATION AND COMPILATION

The optimized levelized modules 255 are fed to the code generation and compilation 260. The goal of the code generation and compilation 260 is to create an executable program that can be run as part of the run-time system 160.

In one embodiment, C code is generated from the optimized levelized modules 255. The native C compiler for the computer system 100 is then used to compile the generated code. For example, in one embodiment, C source code is compiled using the C compiler from Sun Microsystems, Inc. In another embodiment, the code generated is native machine language for the computer system 100.

Essentially, the code generation generates the equivalent C code statements for the statements in the combinational input process 410, the state process 420 and the combinational output process 430. Additional C source code statements are added to ensure that the state information is stored for access by a debugger.

F. RUN-TIME SYSTEM

After the analyzer 130 and the elaborator 140 have completed their processing of the modules, the run-time system 160 can then simulate the design.

Figure 9:
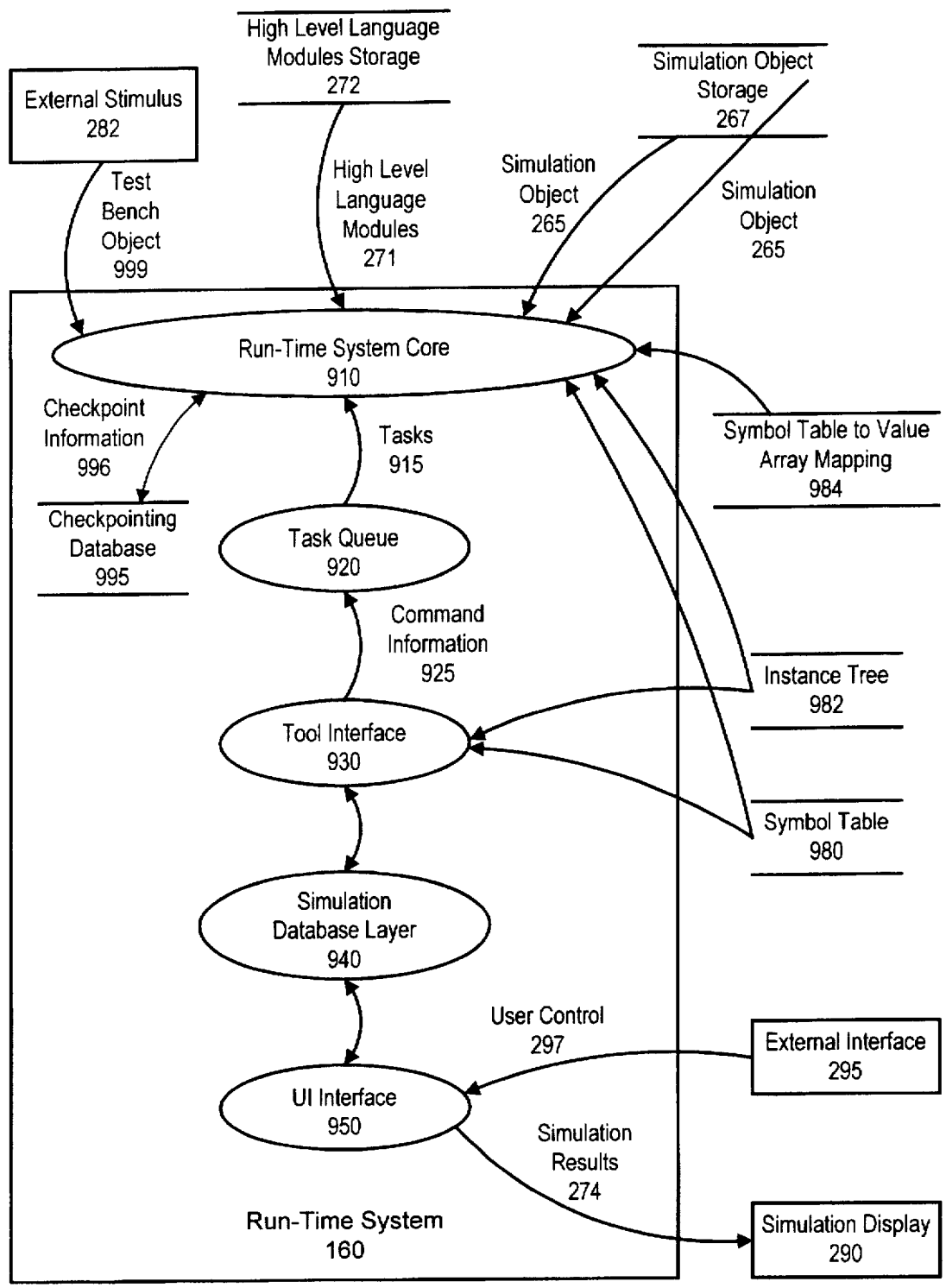
FIG. 9 illustrates one embodiment of the run-time system.

FIG. 9 illustrates one embodiment of the run-time system 160.

The run-time system 160 includes a run-time system core 910 that controls the execution of a simulation and allows the user to debug the design that is being simulated. The run-time system core 910 links all the simulation objects 265 and the high-level language modules 271 with the run-time system core 910. In one embodiment, the high-level language modules 271 are linked with the simulation objects like object code programs are linked by a high-level language compiler and linker (e.g., a C compiler's linker). The run-time system core 910 uses the symbol table 980, the instance tree 982 and the symbol table to value array mapping 984, to track the values of the variables and signals used in the simblks, and the memory used by the high-level language modules 271. The symbol table 980 is created by the analyzer 130. Symbols in the symbol table 980 relate the statements, processes, etc. in the HDL specification of a design to their corresponding code in the simblks. The instance tree 982 is the instance tree created by the analyzer 130. The symbol table to value array mapping 984 maps locations in the value array to the symbol table 980. The value array is a part of the run-time system core 910 that stores the values of signals, variables, and high level language modules'data. Thus, for example, a waveform viewer can access and display a value of a symbol, e.g., a signal, during a simulation.

The designer uses the external interface 295 to communicate commands, via the user control 297, with the run-time system 160. For example, a designer can command the run-time system 160 to simulate a specific design for a specific period of time, or the designer can command the run-time system 160 to display the results of a particular part of the simulation results 274. The run-time system 160 can display the simulation results 274 as a waveform display 170, for example. These external interactions with the user are controlled by the UI interface 950.

The UI interface 950 communicates with the simulation database layer 940. The simulation database layer provides a general access to the simulation results 274. This allows the UI interface 950 to be used with different simulators. Additionally, different UI interfaces 950, and therefore different user interfaces, can be provided with the simulator.

The tool interface 930 provides an interface for tools that communicate with the run-time system 160. The tool interface 930 takes as input the instance tree 982 and the symbol table 980. The tool interface 930 communicates command information 925 to the task queue 920.

The task queue 920 keeps a queue of tasks for the run-time system core 910. These tasks 915 can include start and end times for a simulation, debug requests, requests to access the value of a specific signal.

The run-time system core 910 stores checkpoint information 996 into the checkpointing database 995. A checkpoint is a snapshot of the values of the signals, variables, high level language model memory, and the status of any open files for the simulation objects, for a specific simulation time during the simulation. The checkpoint allows a designer to roll a simulation back to a particular simulation time. In one embodiment, the run-time system core 910 keeps these values in a value array that is in a contiguous block of memory. The run-time system core 910 copies the value array into the checkpointing database 995.

A simulation object 265 can be a test bench object 999. The test bench object 999 is analogous to a main routine in a programming language. The test bench object 999 provides simulation data (external stimuli) to the design that is being simulated. The test bench object 999 includes timing information for when specific triggers should be activated during a simulation.

Figure 10:
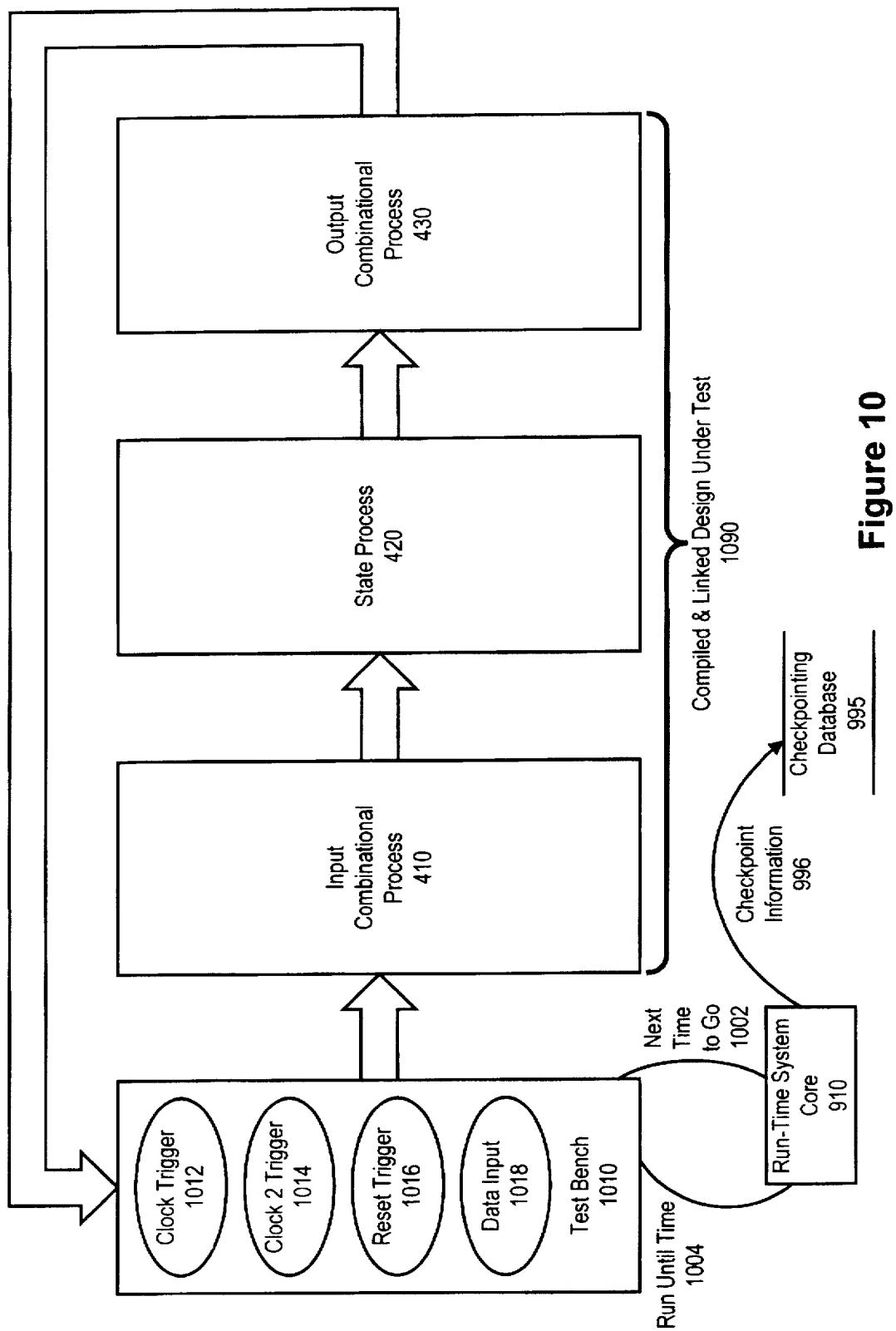
FIG. 10 illustrates the flow of a simulation.

FIG. 10 illustrates the flow of a simulation. In one embodiment, the simulator determines the values of signals in the designer's system at the end of a cycle. A cycle is some period of simulation time. For example, the simulator will provide the values of the signals in the system at 10 ns, 15 ns, 27 ns.

The test bench 1010 includes several processes that include timing information for each trigger. In this example, the designer has included definitions for four inputs to the compiled and linked design under test 1090. The clock trigger 1012 process can include a description of a clock signal. For example, the clock signal can be defined to rise every 10 ns and falling 5 ns after the rise. The clock two trigger 1014 process can be a different phase of the clock trigger 1012. The reset trigger 1016 can correspond to an asynchronous signal, with respect to the clocks. The data input 1018 provides the data ports of the design under test with data signals.

During a simulation, the run-time system core 910 communicates with the test bench 1010. In particular, the run-time system core 910 communicates the simulation end time of the present cycle, represented as the run until time 1004. The test bench 1010 also communicates with the run-time system core 910 to determine the end time of the next simulation, next time to go 1002. The next time to go 1002 is used by the run-time system core 910 to determine, for example, whether a checkpoint should be taken. The following example will help explain the importance of these communications.

Assume the clock trigger 1012 is defined as rising every 10 ns and falling 5 ns after the rise. The clock two trigger 1014 is defined as falling every 12 ns and rising 5 ns after the fall. The reset trigger 1016 will fall at 2 ns and then rise 30 ns later. At the beginning of the simulation, the next time to go 1002 is at 2 ns. The run-time system core 910 performs any checkpoints or other tasks that are to be done before the 2 ns simulation time. The run-time system core 910 then communicates to the test bench 1010 that the simulation should run until time 1004 2 ns. The test bench 1010 would evaluate statements that occur up to 2 ns (including the statements in the reset trigger 1016 process). This would cause the parts of the combinational input process 410, affected by the reset trigger 1016, to be evaluated. (An "effected part" of a process is a part of the process that uses a signal that has changed value.) The values from the combinational input process 410 are pushed out to the effected parts of the state process 420. The state process 420 pushes out its values to the effected parts of the combinational output process 430. The flow of control then returns to the test bench 1010. During the evaluation of these processes other triggers may have been activated (e.g., watchpoints, internally generated triggers, triggers in the test bench 1010 that are waiting for particular values from the design under test). Thus, the evaluation of the effected parts of the test bench 1010, the combinational input process 410, the state process 420 and the combinational output process 430 is repeated until no more triggers are activated. Once no more triggers are activated, the simulation of that cycle is complete.

Figure 11:
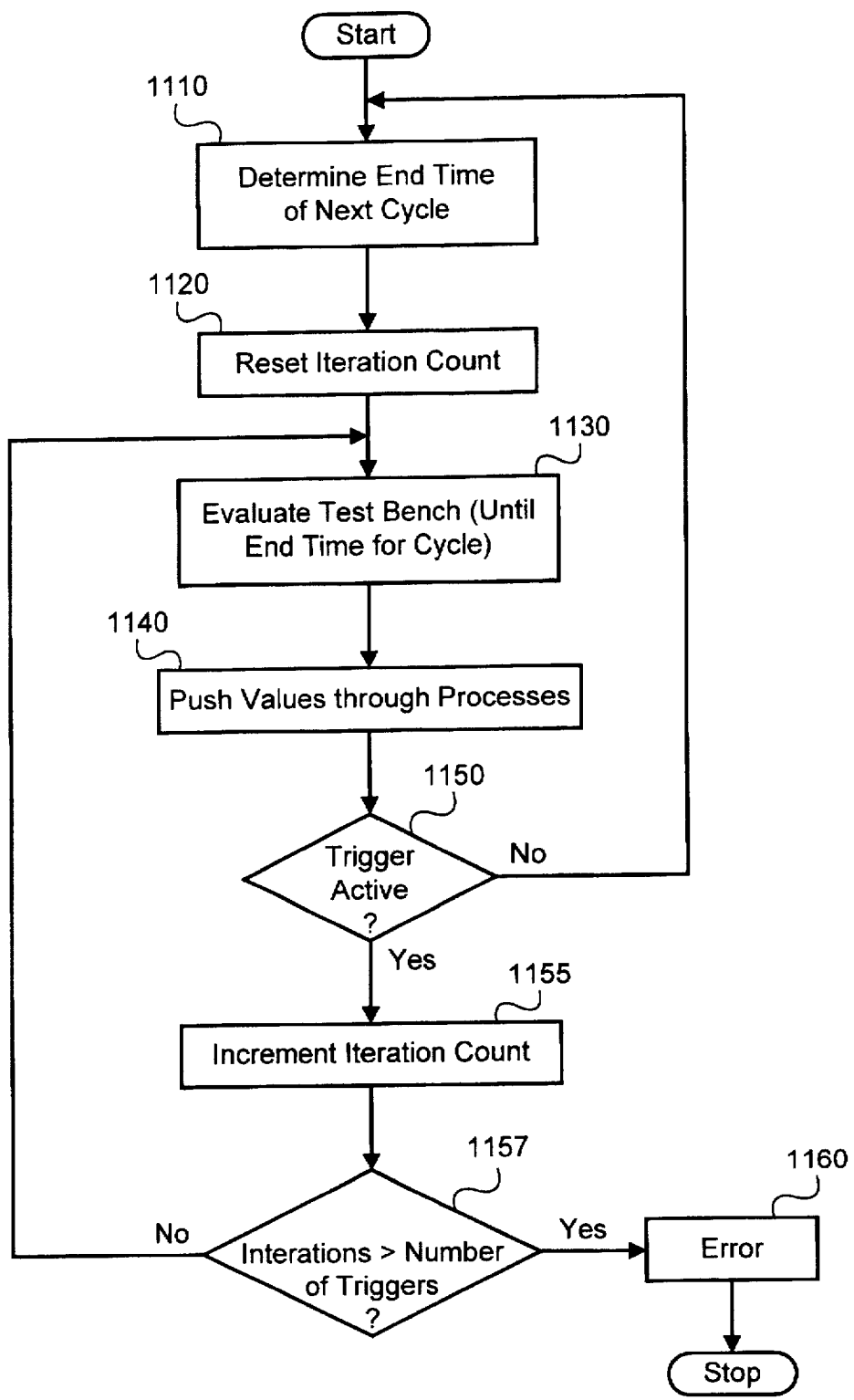
FIG. 11 illustrates one embodiment of a method of simulating a design.

FIG. 11 illustrates one embodiment of a method of simulating a design.

At step 1110, the run-time system core 910 and test bench 1010 determine the end time of the next cycle.

At step 1120, an iteration count is reset. The iteration count is used, for example, to ensure that the values of the combinational feedback loops are resolved within an appropriate number of evaluations of the compiled and linked design under test 1090.

At step 1130, the test bench 1010 is evaluated by evaluating all the processes up to the end time of the present cycle.

At step 1140, the processes in the compiled and linked design under test 1090 are evaluated to determine the values of the signals within the design. These values are pushed from one process to the next.

At step 1150, a test is made to determine whether, during the pushing of the values through the compiled and linked design under test 1090, any triggers were activated. This means that another iteration of the evaluation of the test bench 1010 and the compiled and linked design under test 1090 will be required. A trigger is active if it the process that sets its value has been evaluated and the value has changed as a result. If no triggers are active, then the simulation of that cycle is completed, and the next cycle can begin (step 1110).

At step 1155, some triggers are still active, therefore, the iteration count is incremented.

At step 1157, the iteration count is tested to determine if it has exceeded the number of triggers in the system. If it has, this means that the design is not stable (it has an error similar to an infinite loop—see the above discussion about watchpoints and combinational feedback loops). In one embodiment, if an evaluation activates a trigger in the test bench, the iteration count is decremented because the test bench 1010 may be designed to continue simulating indefinitely. If the iteration count exceeds the number of triggers in the system, then, in one embodiment, an error is reported to the user, step 1160.

We claim:

1. A method of preparing a specification of a system for simulation on a computer system, said specification including a hardware design language specification of said system, said method comprising the steps of:

analyzing said specification to identify a set of processes, each process including a plurality of statements;

determining an evaluation order of said set of processes;

generating a combined process including a portion of said plurality of statements, said portion of said plurality of statements included in said combined process so as to be evaluated according to said evaluation orders;

identifying a set of combinational processes from said set of processes, a combinational process of said set of combinational processes not retaining state information; and determining whether said combinational process to determine whether said combinational process is part of a combinational feedback loop, wherein if said combinational process is part of said combinational feedback loop then determining whether said combinational process can be split to eliminate said combinational feedback loop.

2. The method of claim 1 wherein said determining said evaluation order includes:
classifying each process of said set of processes as being as a state holding process or a non-state holding process.

3. The method of claim 1 further comprising:
determining a set of nets for said set of processes, a first net of said set of nets representing a portion of a signal exchanged between a first process of said set of processes and a second process of said set of processes.

4. The method of claim 3 further comprising determining for each net of said set of nets which of said plurality of processes drive said each net and which of said plurality of processes use said each net.

5. The method of claim 1 wherein if said combinational process can be split to eliminate said combinational feedback loop, then splitting said combinational process into a first combinational process and a second combinational process.

6. The method of claim 1 wherein if said combinational feedback loop cannot be split to eliminate said combinational feedback loop, then identifying a signal of said combinational feedback loop as being a signal that causes a change of state.

7. The method of claim 1 wherein said step of determining said evaluation order includes the steps of:
identifying a bus set of processes that drive a bus net;
creating a bus resolution process to determine a value of said bus net; and
ordering said set of processes so that said bus set of processes are evaluated prior to said bus resolution process.

8. A method of simulating a system on a computer, said method comprising the steps of:
determining an end time of a first cycle;
evaluating a stimulus process using said end time;
evaluating a set of processes that include a combinational feedback loop, said set of processes representing said system, said combinational feedback loop including a state change signal and a process in said combinational feedback loop;
if said state change signal is activated, then evaluating a subset of processes of said set of processes including the process in said combinational feedback loop effected by said state change signal; and
else if said state change signal is not activated, then determining a next end time of a second cycle.

9. The method of claim 8 further comprising, after said evaluating said subset of processes of said set of processes effected by said state change signal, testing to determine whether an number of iterations of evaluation during said first cycle exceeds a number of state change signals in said system.

10. The method of claim 8 wherein said combinational feedback loop includes a first process that outputs a first signal, a second process which receives said first signal and uses said first signal to generate a second signal, and wherein said first signal is generated using said second signal.

11. The method of claim 8 wherein said state change signal is activated if said state change signal is a different value after said evaluating said set of processes that include said combinational feedback loop than before said evaluating said set of processes that include said combinational feedback loop.

12. A computer implemented method of generating an ordered sequence of processes from a plurality of processes, said plurality of processes including a first process and a second process, said plurality of processes representing a hardware description language specification of a system, said method comprising:
determining a set of nets, a first net of said set of nets representing a communication of a signal from a first port of said first process to a second port of said second process;
for each net of said set of nets, determining which processes of said plurality of processes drive said each net and which processes use said each net;
ordering said plurality of processes so that processes that drive said nets are evaluated prior to processes that use said nets; and
testing each process of said plurality of processes that has been identified as being a combinational process to determine whether said each process is part of a combinational feedback loop;
wherein if a process is part of a combinational feedback loop, then attempting to split said process so as to break said combinational feedback loop.

13. The method of claim 12 further comprising, if said process cannot be split so as to break said combinational feedback-loop, then identifying a signal of said combinational feedback loop as a state change producing signal.

14. The method of claim 12 further comprising:
determining a set of bus processes of said set of processes that drive a bus net, said bus net representing a signal where multiple processes output a value for said signal;
adding a bus net resolution process to determine a value of said bus net; and
ordering said set of bus processes to be evaluated prior to said bus net resolution process.

15. A computer program product including:
a computer usable medium having computer readable code embodied therein for causing the preparation of a specification of a system for simulation on a computer system, the computer program product comprising:
a first computer readable program code device configured to cause a computer to effect analyzing said specification to identify a set of processes, each process including a plurality of statements;
a second computer readable program code device configured to cause a computer to effect determining an evaluation order of said set of processes;
a third computer readable program code device configured to cause a computer to effect generating a combined process including a portion of said plurality of statements, said portion of said plurality of statements included in said combined process so as to be evaluated according to said evaluation order;
a fourth computer readable program code device configured to cause a computer to effect identifying a set of combinational processes from said set of processes, a combinational process of said set of combinational processes not retaining state information; and
a fifth computer readable program code device configured to cause a computer to effect determining whether said combinational process to determine whether said combinational process is part of a combinational feedback loop, wherein if said combinational process is part of said combinational feedback loop then determining whether said combinational process can be split to eliminate said combinational feedback loop.

16. A computer program product including:

a computer usable medium having computer readable code embodied therein for causing the generation an ordered sequence of processes from a plurality of processes, said plurality of processes including a first process and a second process, said plurality of processes representing a hardware description language specification of a system, said computer program product comprising:

a first computer readable program code device configured to cause a computer to effect determining a set of nets, a first net of said set of nets representing a communication of a signal from a first port of said first process to a second port of said second process;

a second computer readable program code device configured to cause a computer to effect for each net of said set of nets, determining which processes of said plurality of processes drives said each net and which processes use said each net;

a third computer readable program code device configured to cause a computer to effect ordering said plurality of processes so that processes that drive said nets are evaluated prior to processes that use said nets;

a fourth computer readable program code device configured to cause a computer to effect testing each process of said plurality of processes that has been identified as being a combinational process to determine whether said each process is part of a combinational feedback loop; and a fifth computer readable program code device configured to cause a computer to effect if a process is part of a combinational feedback loop, then attempting to split said process so as to break said combinational feedback loop.

* * * * *

UNITED STATES PATENT AND TRADEMARK OFFICE
CERTIFICATE OF CORRECTION

PATENT NO. : 5,784,593

DATED : July 21, 1998

INVENTOR(S) : Tseng et al.

It is certified that error appears in the above-identified patent and that said Letters Patent is hereby corrected as shown below:

Column 18, Line 59 should read -- order -- instead of "orders"

Signed and Sealed this

Eighth Day of June, 1999

*Attest:*

Q. TODD DICKINSON

*Attesting Officer*     *Acting Commissioner of Patents and Trademarks*